United States Patent [19]

Walker et al.

[11] Patent Number: 4,809,274

[45] Date of Patent: Feb. 28, 1989

[54] DIGITAL AUDIO COMPANDING AND ERROR CONDITIONING

[75] Inventors: Gordon K. Walker, Carlsbad; Ron D. Katznelson, San Diego; Paul Moroney, Cardiff-by-the-Sea; Karl E. Moerder, Poway, all of Calif.

[73] Assignees: M/A-COM Government Systems, Inc.; Cable/Home Communication Corporation, both of San Diego, Calif.

[21] Appl. No.: 91,911

[22] Filed: Sep. 4, 1987

Related U.S. Application Data

[63] Continuation-in-part of Ser. No. 909,776, Sep. 19, 1986, abandoned.

[51] Int. Cl.$^4$ .................... G06F 11/10; H23M 13/22
[52] U.S. Cl. ........................ 371/37; 371/36; 380/19; 380/28
[58] Field of Search ............ 381/13, 94, 106, 16; 371/69, 36, 37; 333/14; 380/19, 1, 28, 43

[56] References Cited

U.S. PATENT DOCUMENTS

| | | | |
|---|---|---|---|
| 3,863,215 | 1/1975 | McGrogan, Jr. | 371/69 |
| 3,919,690 | 11/1975 | Field et al. | 371/69 |
| 4,225,751 | 9/1980 | Hershberger | 381/16 |
| 4,249,042 | 2/1981 | Orban | 381/106 |
| 4,295,223 | 10/1981 | Shutterly | 333/14 |
| 4,322,579 | 3/1982 | Kleis et al. | 381/106 |
| 4,373,115 | 2/1983 | Kahn | 381/16 |
| 4,608,456 | 8/1986 | Paik et al. | 380/28 |
| 4,701,953 | 10/1987 | White | 333/14 |
| 4,704,727 | 11/1987 | Beard | 381/106 |
| 4,742,546 | 5/1988 | Nishimura | 380/28 |
| 4,752,953 | 1/1988 | Paik et al. | 380/28 |

*Primary Examiner*—Salvatore Cangialosi
*Attorney, Agent, or Firm*—Edward W. Callan

[57] ABSTRACT

A system for companding digital audio signal samples processes the digital audio signal samples to correct errors induced by the compression and expansion processes. These errors are calculated prior to compressing the samples. Such errors are calculated in accordance with a predetermined compression process and a predetermined expansion process; and the digital audio signal samples are corrected in accordance with such calculations prior to compression. The compression process includes providing a 3-bit gain word for a block of 70 samples. The gain word is computed in accordance with the position of the most significant "1" bit in the sample(s) having the peak magnitude. Each individual sample is processed in accordance with the block gain word to compress the sample by reducing the number of magnitude bits. The error calculation process includes calculating an error signal by subtracting a calculated reproduced digital audio signal sample from the digital audio signal sample to be compressed, filtering the error signal by noise-spectral filtering and adding the filtered error signal to the next-providing digital audio signal sample to provide a corrected digital audio signal sample for compression. The error calculation process also includes calculating an error value based upon the effect of using a single gain word for compressing a block of samples. The error value is subtracted from the corrected digital audio signal sample prior to compression. The gain word is forward error corrected by (5,1) encoding to enable detection and correction of both single-bit and double-bit errors in transfer by majority voting. The sign bit and the most significant magnitude bits of the compressed samples are forward error corrected to enable detection and correction of single-bit errors in transfer and to enable detection and concealment of double-bit errors in transfer.

15 Claims, 2 Drawing Sheets

DIGITAL AUDIO COMPANDING AND ERROR CONDITIONING

CROSS REFERENCE TO RELATED APPLICATION

This is a continuation-in-part of U.S. patent application Ser. No. 909,776, filed Sept. 19, 1986, now abandoned.

BACKGROUND OF THE INVENTION

The present invention generally pertains to audio signal processing and is particularly directed to improved companding of digital audio signals.

Digital audio signals are companded to conserve transmission bandwidth. A prior art system used for companding digital audio signals for transmission with, and during the horizontal blanking interval of, television signals is described in U.S. Pat. No. 4,608,456 to Woo H. Paik, Jerrold A. Heller and Gordon Kent Walker. In the transmitter of the system described therein, an analog audio signal is converted into digital audio signal samples. Each digital audio signal sample is compressed into a combination of a gain word (referred to therein as an "exponent", a plurality of magnitude bits (referred to therein as a "mantissa") and a sign bit. In the compression process, the most significant bits of the digital audio signal sample are shifted in position in accordance with the value of the gain word; and the other bits are truncated. The compressed digital audio signal sample is forward-error-correction coded by a Hamming code generator, which generates code bits for detecting and correcting single-bit errors in a combination of the sign bit, the gain word and the magnitude bits; and is further forward-error-corrected by a parity bit generator, which generates a parity bit for detecting double-bit errors in a combination of the most significant magnitude bits and/or the parity bit. At the receiver, detected single-bit errors in the transmitted error-coded compressed digital audio signal samples are corrected; and detected double-bit errors are concealed by repeating the last-received correct or corrected sample. The received compressed samples are expanded at the receiver by a process of shifting the position of the received magnitude bits in accordance with the value of the gain word and by appending bits of a nominal value in the unfilled bit positions remaining after such shift to reproduce the digital audio signal samples. The reproduced digital audio signal samples are converted to a reproduced analog audio signal. By virtue of the truncation and appending steps in the respective compression and expansion processes, errors are inevitably induced in the reproduced digital audio signal samples.

SUMMARY OF THE INVENTION

The present invention provides a system for processing the digital audio signal samples to correct errors induced by the compression and expansion processes. These errors are calculated prior to compressing the samples. Such errors are calculated in accordance with the predetermined compression process and the predetermined expansion process; and the digital audio signal samples are corrected in accordance with such calculations prior to compression. More specifically, the system of the present invention includes means for providing a gain word for a first digital audio signal sample; means for processing said first digital audio signal sample with said gain word in accordance with a first predetermined process to compress said first digital audio signal sample; means for processing said gain word and said compressed first digital audio signal sample in accordance with a second predetermined process to provide a reproduced digital audio signal sample; means for calculating the effect of said first and second predetermined processes upon the accuracy of the reproduced digital audio signal sample; and means for processing the first digital audio signal sample in accordance with said calculated effect to provide a corrected digital audio signal sample for said compression in accordance with said first predetermined process.

Preferably, the means for calculating the effect of said first and second predetermined processes upon the accuracy of the reproduced digital audio signal sample includes means for processing the first digital audio signal sample and the gain word for said sample to provide a calculated reproduced digital audio signal sample; and the means for providing a corrected digital audio signal sample includes means for subtracting the calculated reproduced digital audio signal sample from the related first digital audio signal sample to provide an error signal; means for filtering said error signal by noise-spectral filtering; and means for adding the filtered error signal to the next-provided first digital audio signal sample to provide the corrected digital audio signal sample.

In a separate aspect, the present invention also provides forward error correction of the gain word to enable detection and correction of double errors in each bit of the gain word. The system of the present invention providing this feature includes means for providing a gain word for a first digital audio signal sample; means for processing said first digital audio signal sample with said gain word in accordance with a first predetermined process to compress said first digital audio signal sample for transfer to a decoder together with said gain word; means for processing gain word and said compressed first digital audio signal sample in accordance with a second predetermined process to provide a reproduced digital audio signal sample; means for encoding each bit of the computed gain word for transfer to the decoder by repeating each bit five times and; means for decoding each bit of the encoded gain word by majority vote processing of the five repeated bits to thereby correct any single or double errors in the transfer of each bit of the gain word in accordance with said majority vote. The term "transfer" means transmission to a receiver and/or storage and retrieval.

In another aspect of the invention, a single gain word is provided for a block of digital audio signal samples. The means for providing the gain word detects the peak first digital audio signal sample magnitude within a block of a predetermined number of first digital audio signal samples and computes the gain word for said block of samples in accordance with the position of the most significant "1" bit in the first digital audio signal sample(s) having the detected peak magnitude; and the compressing means processes the computed block gain word with each of the said digital audio signal samples in said block when compressing the first digital audio signal samples of said block. The means for calculating the effect of said first and second predetermined processes upon the accuracy of the reproduced digital audio signal sample calculates the effect of using a single gain word for said block of samples upon the accuracy of each reproduced digital audio signal sample;

and the fist digital audio signal samples are processed in accordance with said calculated effect to correct each digital audio signal sample for said compression in accordance with said first predetermined process.

Additional features of the present invention are described in relation to the description of the preferred embodiment.

DESCRIPTION OF THE PREFERRED EMBODIMENTS

Figure 1:
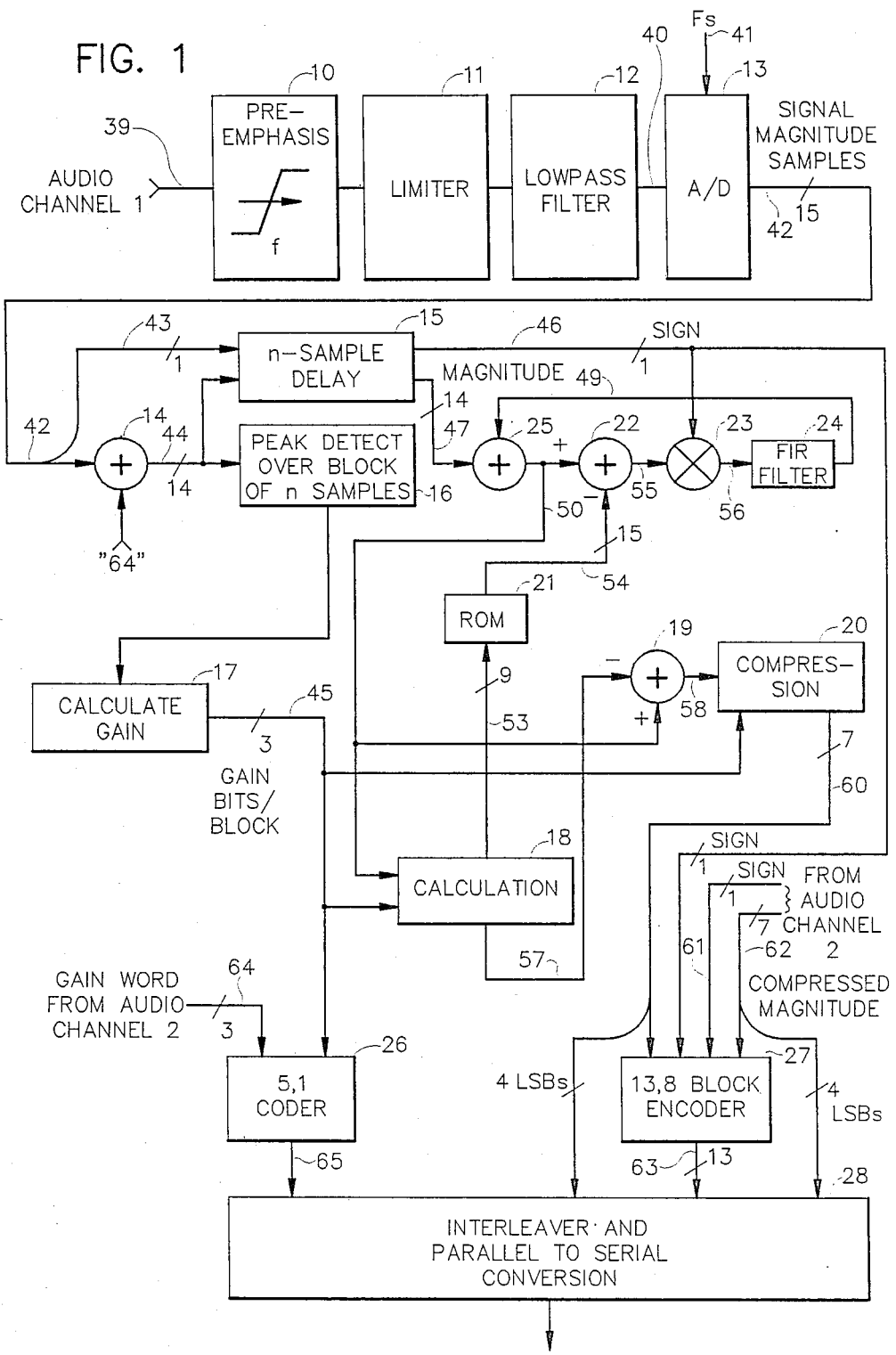
FIG. 1 is a block diagram of a first portion of a preferred embodiment of the audio processing system of the present invention located at an encoder.

Referring to FIG. 1, in one preferred embodiment of the present invention, the portion of the audio processing system located at the encoder includes the following components for each audio channel, a preemphasis unit 10, a limiter 11, a 15 kHz lowpass filter 12, an analog-to-digital (A/D) converter 13, a first adder 14, a delay unit 15, a peak detection unit 16, a gain calculation unit 17, an output calculation unit 18, a first subtraction unit 19, a compression unit 20, a read-only memory (ROM) 21, a second subtraction unit 22, a multiplier 23, a finiteimpulse-response (FIR) filter 24, and a second adder 25. The encoder portion of the system further includes a (5,1) forward-error-correction encoder 26, a (13,8) forward-error-correctio block encoder 27, and an interleaver and parallel-to-serial conversion formatting unit 28.

Figure 2:
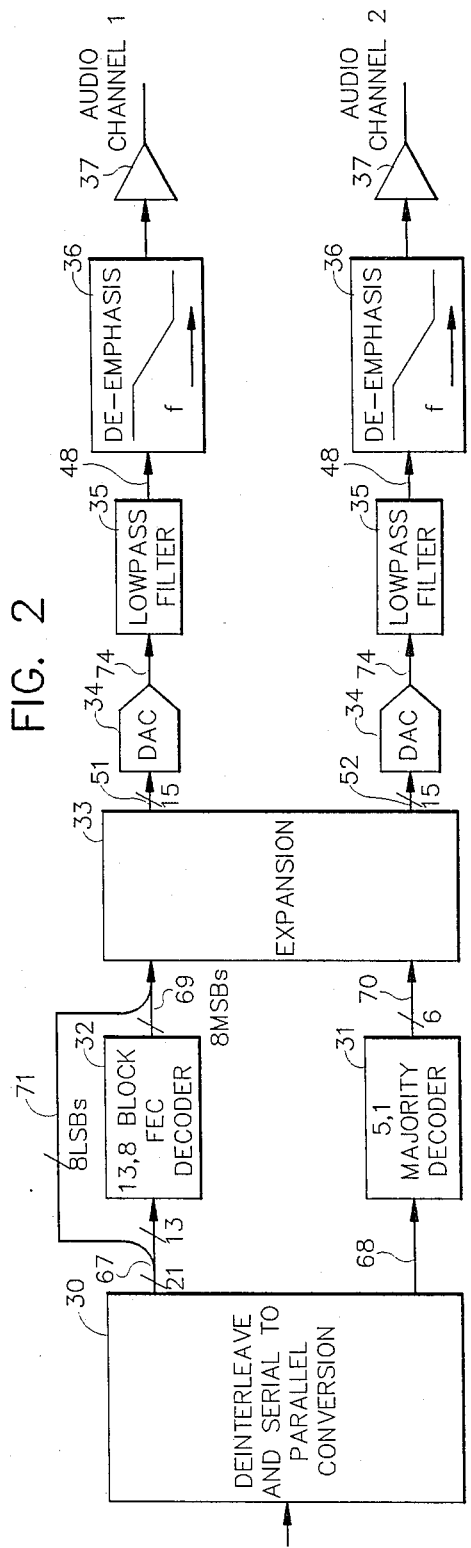
FIG. 2 is a block diagram of a second portion of a preferred embodiment of the audio processing system of the present invention located at a decoder.

Referring to FIG. 2, the portion of the audio processing system located at the decoder includes a deinterleaver and serial-to-parallel conversion formatting unit 30, a (5,1) forward-error-correction decoder 31, a (13,8) forward block decoder 32 and an expansion unit 33. The decoder portion further includes two audio channels, each of which includes a digital-to-analog converter (DAC) 34, a lowpass filter 35, a deemphasis unit 36, and an audio amplifier 37.

Referring again to FIG. 1, an analog audio signal on line 39 is preemphasized by the preemphasis unit 10, clipped by the limiter 11 and filtered by the lowpass filter 12 prior to being provided on line 40 to the A/D converter 13. The A/D converter 13 samples the analog signal at a sampling rate of $F_2$ in accordance with the frequency of a clock signal on line 41, to thereby provide digital audio signal samples on fifteen parallel lines 42.

Each digital audio signal sample is a binary signal consisting of fifteen bits, including a sign bit "A" and fourteen magnitude bits "B, C, D, E, F, G, H, I, J, K, L, M, N and O" in decreasing order of significance. The sign bit is separated from the sample and provided on line 43 to the delay unit 15.

The system of FIGS. 1 and 2 is adapted for companding the digital audio signal samples in accordance with a $\mu$-law output structure. Therefore, a binary bit having the value of "64" is added to the fourteen magnitude bits by the adder 14 to provide the magnitude bits for compression on line 44. Any overflow resulting from such addition is suppressed. When an A-law output structure is used, there is no need to add an additional value to the sample; hence the adder 14 is not included.

A single gain word is computed for a block of seventy samples. The gain word is computed and provided on line 45 by the gain calculation unit 17 in response to detection by the peak detection unit 16 of the peak digital audio signal magnitude within the block of the seventy samples. The gain word is computed for the block of samples in accordance with the position of the most significant "1" bit in the sample(s) having the peak magnitude. The gain word is a three bit word having a binary value of "7" ("111") when the most significant bit "B" is a "1" bit. The binary value of the computed gain word decreases from "7" by "1" for each bit position that the most significant "1" bit of the detected peak-magnitude sample is less than the most significant bit position "B". The provision of a three-bit gain word thereby provides eight possible ranges of magnitude values to be represented by the combination of the gain word and the compressed magnitude bits of the digital audio signal samples.

The block companding process described herein saves almost two bits per sample in contrast to system with instantaneous companding and yet reproduces peak signals with equivalent precision.

The delay unit 15 delays the sign bit on line 43 and the magnitude bits on lines 44 for the duration of the block of seventy samples while the peak sample magnitude is being detected and the gain word is being computed. Delayed sign bits are provided on line 46 and the delayed fourteen magnitude bits of the digital audio signal sample are provided on lines 47.

The second adder 25 adds a filtered error signal on line 49 to the magnitude bits on lines 47 to correct the magnitude bits of the digital audio signal sample and thereby provide a corrected sample of the magnitude bits on line 50. The production of the error signal on line 49 will be described below.

The output calculation unit 18 processes each sample of the magnitude bits on lines 50 with the gain word on lines 45 for the block that includes such sample in accordance with the compression process of the compression unit 20 and the expansion process of the expansion unit 33 to calculate the effect of such compression and expansion processes upon the accuracy of the reproduced digital audio signal provided by the expansion unit 33 on line 51. The results of such compression and expansion processes are shown in Table 1.

TABLE 1

| MSB | GAIN WORD | COMPRESSED MAGNITUDE BITS | REPRODUCED MAGNITUDE BITS |
| --- | --- | --- | --- |
| B | 111 | BCDEFGH | BCDEFGH1000000 |
| C | 110 | CDEFGHI | 0CDEFGHI100000 |
| D | 101 | DEFGHIJ | 00DEFGHIJ10000 |
| E | 100 | EFGHIJK | 000EFGHIJK1000 |
| F | 011 | FGHIJKL | 0000FGHIJKL100 |
| G | 010 | GHIJKLM | 00000GHIJKLM10 |
| H | 001 | HIJKLMN | 000000HIJKLMN1 |
| I-O | 000 | IJKLMNO | 0000000IJKLMNO |

Table 1 shows the relationship between the most significant bit position having a "1" bit in the detected peak magnitude sample(s), the computed gain word and the compressed magnitude bits provided in accordance with the compression process performed by the compression unit 20. The magnitude bits in the remaining positions of the binary digital audio signal sample on lines 50 are truncated.

Table 1 further shows the corresponding binary values of the reproduced digital audio signal samples provided in accordance with the expansion process performed by the expansion unit 33. Note that in the expansion process a "1" bit representing one-half the value of the least significant magnitude bit of the compressed magnitude bits is appended to the compressed magnitude bits to represent the average value of the magnitude bits that were truncated by the compression process.

The output calculation unit 18 provides calculated compressed magnitude bits for each sample on line 53 to the ROM 21. The ROM 21 permanently stores all of the different combinations of the fourteen calculated reproduced magnitude bits corresponding to each possible combination of calculated compressed magnitude bits, and responds to the calculated compressed magnitude bits on lines 53 by providing the fourteen calculated reproduced magnitude bits for the immediately processed sample on lines 54 to the second subtraction unit 22.

The subtraction unit subtracts the calculated compressed magnitude bits on lines 54 from the magnitude bits of the digital audio signal sample on lines lines 50 to provide a system output error signal on lines 55.

The multiplication unit 23 multiplies the error signal on lines 55 by the sign bit on line 46 to provide an error signal on lines 56 that is filtered by the FIR filter 24.

The FIR filter 24 filters the error signal on lines 56 to provide the filtered error signal on line 49 that is added by the second adder 25, as described above. The adder 25 adds the filtered error signal on lines 49 to the next-provided digital audio signal sample on line 47. Thus errors from prior samples are accumulated and a smaller output error is possible, when the output bandwidth of the system is less than the sampling rate F]hd 2/2.

The FIR filter 24 processes the error signal on lines 56 by noise-spectral filtering to reduce audibly perceived truncation errors and/or RMS truncation errors when the filtered error signal is added to the next-provided digital audio signal sample on lines 47. The filtering characteristics are determined by the selection of the coefficients of the FIR filter 24.

The noise shaping feature allows the system designer to change the spectral content of quantization noise generated by the compression unit 20. Traditionally, preemphasis and deemphasis are used to contour an audio system's noise spectral density to improve the perceived quality. There have always been complaints about the loss of head room due to preemphasis (clipping will occur at lower levels for high frequencies than lower frequencies.) The use of noise shaping to contour the system noise does not produce any such difference in clipping level versus frequency. Preemphasis and deemphasis are nevertheless retained in the preferred embodiment because the subjective effects of bit errors are significantly reduced by the deemphasis. Accordingly, the preemphasis unit 10 contours the spectral density of the input analog audio signal on line 39; and the deemphasis unit 36 (FIG. 2) deemphasizes he reproduced analog audio signal on line 48 to contour the quantization noise spectral density of the reproduced analog audio signal. Such contouring reduces the audibly perceived effect of any bit errors in the reproduced digital audio signal samples.

Noise shaping is a method typically used to reduce the number of input or output states required in a D/A or A/D process operated at several times the required Nyquist sampling rate. In the system of the present invention the noise shaping process is applied to slightly oversampled systems. (10 to 20%). There are significant gains in signal to quantization noise ratios for large signals possible with this feature. Fore example, when the RMS error in a 20 kHz bandwidth is measured with the sampling frequency equal to 44 kHz, the output bandwidth equal to 18.7 kHz, and preemphasis and deemphasis applied (50/15 $\mu$sec time constants), the gain is 3.1 dB. There are larger subjective gains available by selecting a different criteria for the coefficients of FIR filter 24. By compromising the RMS improvement obtained in a 20 kHz bandwidth by 0.1 dB, the perceived signal to quantization ratio can be improved to 6.0 dB. This is equivalent to one bit of additional accuracy or conversely allows an additional bit of compression for equivalent perceived quality.

Another benefit realized with this feature is primarily a subjective advantage. Correlated error components can occur on low slope (low frequency) signals when there is insufficient dither. The correlation of adjacent samples results in inharmonic tones of varying frequency. This is particularly sever for low frequency signals (20-100 Hz) since the inharmonic tones occur around 1 kHz where the human ear is most sensitive. This is more audible and disturbing than equivalent amounts of white noise added to the signal, which is the effect when there is no correlation between adjacent samples. The feedback structure of the FIR filter 24 breaks up correlated signal components by effectively dithering the input audio samples with shaped quantizing noise.

The output calculation unit 18 also provides on line 57 an error value that is related to the effect of using a gain word for a block of samples when companding individual samples of the block. As noted above, in the expansion process, a "1" bit representing one-half the value of the least significant magnitude bit of the compressed magnitude bits is appended to the compressed magnitude bits to represent the average value of the magnitude bits that were truncated by the compression process. Depending upon the appropriateness of the block gain word for the individual sample, the effect of appending this particular "1" bit can be quite significant. For example, if the block gain word is "111" and the most significant "1" bit of the sample is in bit position "J", the effect of appending this particular "1" bit upon expansion is the same as adding the binary value of "64" to the individual sample. Thus, for this example, the output calculation unit provides an error value on lines 57 having a binary value of "64". Table 2 shows the calculated error values for different gain words in relation to the bit position of the most significant "1" bit in the individual digital audio signal sample.

TABLE 2

| GAIN WORD | ERROR VALUES MSB POSITION | | | | | | | |
|---|---|---|---|---|---|---|---|---|
| | B | C | D | E | F | G | H | J |
| 111 | 0 | 1 | 2 | 4 | 8 | 16 | 32 | 64 |
| 110 | 0 | 0 | 1 | 2 | 4 | 8 | 16 | 32 |
| 101 | 0 | 0 | 0 | 1 | 2 | 4 | 8 | 16 |
| 100 | 0 | 0 | 0 | 0 | 1 | 2 | 4 | 8 |
| 011 | 0 | 0 | 0 | 0 | 0 | 1 | 2 | 4 |
| 010 | 0 | 0 | 0 | 0 | 0 | 0 | 1 | 2 |
| 001 | 0 | 0 | 0 | 0 | 0 | 0 | 0 | 1 |
| 000 | 0 | 0 | 0 | 0 | 0 | 0 | 0 | 0 |

The subtraction unit 19 subtracts the error value on lines 57 from the magnitude bits on line 50 to provide a corrected digital audio signal sample on line 58 for compression by the compression unit 20. The compression unit 20 provides the seven compressed magnitude bits on lines 60.

The digital signal is forward-error-correction coded for transfer. The sign bit on line 46 and the three most significant magnitude bits on lines 60 are provided to the (13,8) block encoder 27 together with corresponding sign and magnitude bits on lines 61 and 62 from a paired audio channel. The (13,8) block encoder 27 provides five parity bits for the eight sign and magnitude bits provided thereto and provides the five parity bits together with these eight sign and magnitude bits on thirteen lines 63 to the interleaver and parallel-to-serial conversion unit 28.

The (13,8) encoder encodes these eight sign and magnitude bits to enable detection and correction of single-bit errors in the transfer of these eight bits and to enable detection of double-bit errors therein. A moderately exhaustive search was performed to select the code implemented by the (13,8) encoder; and a large group of codes with roughly equivalent distance profiles exits. The cyclic code derivative was selected for ease of implementation, in that it allows an area efficient decoder implementation. The selected code generator matrix is shown in Table 3. The notation for presenting such a matrix is described in "Information Theory and Reliable Communication" by R.G. Gallager (1968).

TABLE 3

|   |   | 1 | 0 | 1 | 0 | 1 |
|---|---|---|---|---|---|---|
|   |   | 1 | 1 | 1 | 1 | 1 |
|   |   | 1 | 1 | 0 | 1 | 0 |
| I |   | 0 | 1 | 1 | 0 | 1 |
|   |   | 1 | 0 | 0 | 1 | 1 |
|   |   | 1 | 1 | 1 | 0 | 0 |
|   |   | 0 | 1 | 1 | 1 | 0 |
|   |   | 0 | 0 | 1 | 1 | 1 |

I = 8 × 8 IDENTITY MATRIX

The error control is as effective, but more efficient than in the prior art. The system described in the above-referenced U.S. Pat. No. 4,608,456 provides single-bit error correction and double-bit error detection and concealment, but requires 4 bits per sample to achieve this. The number of holds generated varies as approximately two times the channel probability bit error rate ($P_E$). The European Broadcasting Union has described a system which achieves double-bit error detection and single-bit error correction at 5 bits/sample with a hold rate of 78 $P_E^2$ which is superior to the described in the system of the '456 patent at bit rates less than $2.6 \times 10^{-2}$ where both systems operate. ("Specification of the System of the MAC/Packet Family", Tech. 3258-E, European Broadcasting Union, Oct. 1986, Technical Center-Brussels). The error control described herein has 2.5 bits per audio sample, and the same 78 $P_E^2$ hod rate characteristics. The prior art has roughly equivalent error control in terms of capability, but the efficiency of this system is 1.5 to 2.5 bits per sample more efficient.

Overall the compression algorithm is 2 bits/sample superior to prior art. The noise shaping compression process of the present invention is interoperable with $\mu$-law or A-law DACs and saves 1 bit per sample. The error control is equivalent to that of the prior art with 1.5 to 2.5 bits saving per sample. The overall result is a 4.5 to 5 bits per sample savings with equivalent quality. Additionally, granularity on low slope signals is reduced.

The gain word on lines 45 is provided to the (5.1) encoder 26 together with a gain word on lines 64 for the paired audio channel from which the sign bit on line 61 and the seven magnitude bits on lines 62 are derived. The (5,1) encoder provides each of the six gain word bits five times on line 65 to the interleaver and parallel-to-serial conversion unit 28. The gain words are thereby forward-error-correction coded to enable detection and correction of both single and double errors in the transfer of any bit of a gain word by majority vote processing the five repeated bits.

The four least significant bits of the compressed magnitude bits provided on each of lines 60 and 62 respectively are provided directly to the interleaver and parallel-to-serial conversion unit 28 without any forward-error-correction coding.

The interleaver and parllel-to-serial conversion unit 28 interleaves the sign bits, the magnitude bits and the parity bits in accordance with the delay pattern set forth in Table 4 so as to provide a Hamming distance of ten between coded bits of the same sample. Thus noise bursts up to the ten samples in duration can be handled. The interleaving of the uncoded least significant magnitude bits reduces RMS noise energy.

TABLE 4

| SERIAL ORDERED POSITION ON CHANNEL | TYPE OF BIT | DEINTERLEAVER DELAY | INTERLEAVER DELAY |
|---|---|---|---|
| 1 | SIGN BIT, LEFT | 0 | 5 |
| 2 | SIGN BIT, RIGHT | 1 | 4 |
| 3 | (MS) MAGNITUDE BIT 6, LEFT | 2 | 3 |
| 4 | (MS) MAGNITUDE BIT 6, RIGHT | 3 | 2 |
| 5 | MAGNITUDE BIT 5, LEFT | 4 | 1 |
| 6 | MAGNITUDE BIT 5, RIGHT | 5 | 0 |
| 7 | (LS) MAGNITUDE BIT 0, LEFT | 1 | 4 |
| 8 | (MS) MAGNITUDE BIT 0, RIGHT | 2 | 3 |
| 9 | MAGNITUDE BIT 1, LEFT | 3 | 2 |
| 10 | MAGNITUDE BIT 1, RIGHT | 4 | 1 |
| 11 | MAGNITUDE BIT 4, LEFT | 0 | 5 |
| 12 | MAGNITUDE BIT 4, RIGHT | 1 | 4 |
| 13 | PARITY BIT 4 | 2 | 3 |
| 14 | PARITY BIT 3 | 3 | 2 |
| 15 | PARITY BIT 2 | 4 | 1 |
| 16 | PARITY BIT 1 | 5 | 0 |

TABLE 4-continued

| SERIAL ORDERED POSITION ON CHANNEL | TYPE OF BIT | DEINTERLEAVER DELAY | INTERLEAVER DELAY |
|---|---|---|---|
| 17 | MAGNITUDE BIT 2, LEFT | 1 | 4 |
| 18 | MAGNITUDE BIT 2, RIGHT | 2 | 3 |
| 19 | MAGNITUDE BIT 3, LEFT | 3 | 2 |
| 20 | MAGNITUDE BIT 3, RIGHT | 4 | 1 |
| 21 | PARITY BIT 0 | 0 | 5 |

Referring to Table 4, the terms "left" and "right" are used to designate two different audio channels; and the terms "MS" and "LS" refer to most significant and least significant, respectively.

One gain word bit is transferred for every forty-nine interleaved sample bits; hence it is not necessary to also interleave the gain word bits.

Figure 3:
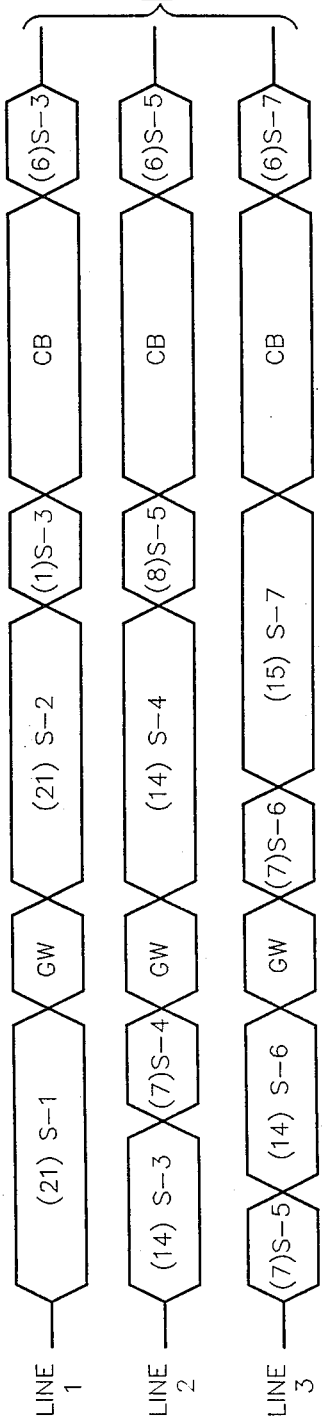
FIG. 3 illustrates the format in which the forward-error-corrected samples are transferred.

In a preferred embodiment, in which the compressed and coded bits are transferred during the horizontal blanking interval HBI) of a television signal, the interleaver and parallel-to-serial conversion unit 28 provides the bits in the order shown in FIG. 3 in each sequence of three video lines. Referring to FIG. 3, "S-1" indicates set number one in a sequence; the number in parentheses indicates the number o bits from that set, "GW" indicates one gain word bit; and "CB" indicates the video color burst that is typically broadcast during the HBI. Seven complete sets are transferred over the duration of three video lines. Thus a block of seventy coded, compressed digital audio signal samples for a pair of audio channels are transferred during the duration of thirty video lines. During this 30-line duration, thirty gain word bits are transferred thereby providing five repetitions of each of the three gain word bits for each of the two audio channels.

In the decoder, as shown in FIG. 2, the deinterleaver and serial-to-parallel conversion unit 30 deinterleaves the transferred coded and compressed sample bits and provides the deinterleaved bits in parallel on lines 67, with the eight coded bits being provided to the (13,8) block FEC decoder 32. The deinterleaver and serial-to-parllel conversion unit 30 also provides the repeated gain word bits on line 68 to the (5,1) majority decoder 31. The deinterleaver delays are set forth in Table 4 above.

The (13,8) block decoder 32 detects and corrects any single-bit errors in the set of eight coded bits and detects and conceals any double-bit errors in the set of eight coded bit. Concealment is accomplished by repeating the last correct or corrected paired samples in lieu of the samples in which the detected double-bit errors occur. The (13,8) block decoder 32 provides the eight decoder sign and magnitude bits on lines 69 to the expansion unit 33.

The (5,1) majority decoder 31 detects and corrects any single-bit or double-bit errors by majority voting of the five repeated bits for each bit of the gain word, and provides the three gain word bits for each of the two audio channels in parallel on line 70 to the expansion unit 33.

The least significant of the compressed magnitude bits were not coded for transfer to the decoder (FIG. 2), whereby they are provided directly to the expansion unit 33 on lines 71.

The expansion unit 33 separates the gain words and sign and magnitude bits for the separate audio channels and processes the gain word, sign bit and magnitude bits of an individual sample for a single channel to provide reproduced digital audio signal samples for each of the audio channels on separate 15-bit line sets 51 and 52 respectively. The composition of the reproduced digital audio signal samples provided by the expansion unit 33 is set forth in Table 1, above. When a $\mu$-law companding process is utilized, the binary value of "64" is subtracted from the binary signal value of the reproduced digital audio signal sample by the expansion unit prior to providing the reproduced digital audio signal samples on lines 51 and 52 for conversion to analog audio signals by the DACs 34.

In each audio output channel, the DAC 34 converts the reproduced digital audio signal samples on lines 51 into an analog audio signal on line 74. Alternatively a companding DAC may be used. A companding DAC combines the expansion and digital-to-analog conversion functions. Companding DAC's for accomplishing either $\mu$-lay or A-law expansion are known to those familiar with the digital signal companding art. Such companding DACs are readily available and their use results in savings in manufacturing costs.

We claim:

1. A system for processing audio signals, comprising
    means for providing a gain word for a first digital audio signal sample;
    means for processing said first digital audio signal sample with said gain word in accordance with a first predetermined process to compress said first digital audio signal sample;
    means for processing said gain word and said compressed digital audio signal sample in accordance with a second predetermined process to provide a reproduced digital audio signal sample;
    means for calculating the effect of said first and second predetermined processes upon the accuracy of the reproduced digital audio signal sample; and
    means for processing the first digital audio signals ample in accordance with said calculated effect to provide a corrected digital audio signal sample for said compression in accordance with said first predetermined process.

2. A system according to claim 1, wherein the means for calculating the effect of said first and second predetermined processes upon the accuracy of the reproduced digital audio signal sample comprises
    means for processing the first digital audio signal sample and the gain word for said sample to provide a calculated reproduced digital audio signal sample; and
    wherein the means for providing a corrected digital audio signal sample comprises
    means for subtracting the calculated reproduced digital audio signal sample from the related first digital audio signal sample to provide an error signal;
    means for filtering said error signal by noise-spectral filtering; and means for adding the filtered error signal to the next-provided first digital audio signal sample to provide the corrected digital audio signal sample.

3. A system according to claim 2, wherein the filtering means processes the error signal to reduced audibly perceived truncation errors and/or to reduce RMS truncation errors when the filtered error signal is added to the next-provided first digital audio signal sample.

4. A system according to claim 2, further comprising
means for preemphasizing an analog audio input signal to contour the spectral density of said analog audio input signal;
means for converting said preemphasized analog audio input signal into said digital audio signal samples;
means for converting said reproduced digital audio signal samples into a reproduced analog audio signal; and
means for deemphasizing the reproduced analog audio signal to contour the quantization noise spectral density of said reproduced analog audio signal;
wherein said contouring reduces the audibly perceived effect of any bit errors in the reproduced digital audio signal samples.

5. A system according to claim 2,
wherein the means for providing the gain word comprises
means for detecting the peak first digital audio signal sample magnitude within a block of a predetermined number of first digital audio signal samples;
means for computing the gain word for said block of samples in accordance with the position of the most significant "1" bit in the first digital audio signal sample(s) having he detected peak magnitude;
wherein the compressing means processes said computed gain word for said block of samples with each of said digital audio signal samples in said block when compressing the first digital audio signal samples of said block;
wherein the calculating means comprises
means for processing the first digital signal sample and the gain word for said block of samples to provide an error value related to the effect of using said gain word for said block of samples when compressing individual first digital audio signal samples; and
means for providing an error value related to the effect of using said gain word for said block of samples when compressing individual first digital audio signal samples; and
wherein the means for providing a corrected digital audio signal sample comprises
means for processing the error value with said corrected digital audio signals ample to compensate for said error value prior to compression of said corrected digital audio signal sample in accordance with said first predetermined process.

6. A system according to claim 1,
wherein the means for providing the gain word comprises
means for detecting the peak first digital audio signal sample magnitude within a block of a predetermined number of first digital audio signal samples; and
means for computing the gain word for said block of samples in accordance with the position of the most significant "1" bit in the first digital audio signal sample(s) having the detected peak magnitude;
wherein the compressing means processes said computed gain word for said block of samples with each of said digital audio signal samples in said block when compressing the first digital audio signal samples of said block;
wherein the calculating means comprises
means for processing the first digital audio signal sample and the gain word for said block of samples to provide an error value related to the effect of using said gain word for said block of samples when compressing individual first digital audio signal samples; and
wherein the means for providing a corrected digital audio signal sample comprises
means for processing the error value with said first digital audio signal sample to compensate for said error value and to thereby provide said corrected digital audio signal sample for compression in accordance with said first predetermined process.

7. A system according to claim 6, further comprising
means for forward-error-correction coding only the more significant bits of the compressed first digital audio signal sample for transfer in order to enable correction of single-bit errors in said transfer of said coded sample bits and in order to detect double-bit errors in said transfer of said coded sample bits.

8. A system according to claim 7, further comprising
means at said decoder for detecting and correcting single-bit errors in said coded bits of said compressed digital audio signal sample and for detecting and concealing double-bit errors in said coded bits of said compressed digital audio signal sample.

9. A system according to claim 8, wherein the computed gain word is a three-bit word to thereby provide eight possible ranges of magnitude values to be represented by the combination of the gain word and the compressed digital audio signal samples.

10. A system according to claim 7, wherein the computed gain word is a three-bit word to thereby provide eight possible ranges of magnitude values to be represented by the combination of the gain word and the compressed digital audio signal samples.

11. A system for processing audio signals, comprising
means for providing a gain word for a first digital audio signal sample;
means for processing said first digital audio signals ample with said gain word in accordance with a first predetermined process to compress said first digital audio signal sample for transfer to a decoder together with said gain word;
means at said decoder for processing said gain word and said compressed first digital audio signal sample in accordance with a second predetermined process to provide a reproduced digital audio signal sample;
means for encoding each bit of the computed gain word for said transfer by repeating each bit five times and;
means for decoding each bit of the encoded gain word by majority vote processing of the five repeated bits to thereby correct any single or double errors in the transfer of each bit of the gain word in accordance with said majority vote.

12. A system according to claim 11, further comprising
means for forward-error-correction coding only the most significant bits of the compressed first digital audio signal sample for transfer in order to enable correction of single-bit errors in said transfer of said coded sample bits and in order to detect double-bit errors in said transfer of said coded sample bits.

13. A system according to claim 12, further comprising means at said decoder for detecting and correcting single-bit errors in said coded bits of said compressed digital audio signal sample and for detecting and concealing double-bit errors in said coded bits of said compressed digital audio signal sample.

14. A system according to claim 11, wherein the computed gain word is a three-bit word to thereby provide eight possible ranges of magnitude values to be represented by the combination of the gain word an the compressed digital audio signal samples.

15. A system for processing audio signals, comprising means for providing a gain word for a block of first digital audio signal samples by detecting the peak first digital audio signal sample magnitude within a block of a predetermined number of first digital audio signal samples, and computing the gain word for said block of samples in accordance with the position of the most significant "1" bit in the first digital audio signal sample(s) having the detected peak magnitude;

means for processing each said first digital audio signal sample of said block with said gain word in accordance with a first predetermined process to compress said first digital audio signal samples;

means for processing the gain word and the compressed first digital audio signal samples in accordance with a second predetermine process to provide reproduced digital audio signal samples;

means for calculating the effect of using a single gain word for said block of samples upon the accuracy of each reproduced digital audio signal sample; and means for processing the first digital audio signal samples in accordance with said calculated effect to correct each digital audio signal sample for said compression in accordance with said first predetermined process.

* * * * *